(12) United States Patent
Circenis et al.

(10) Patent No.: US 7,636,643 B1
(45) Date of Patent: Dec. 22, 2009

(54) GAUGE HAVING A DYNAMICALLY UPDATED INDICIA OF A VALUE'S NORMAL RANGE, AND METHODS AND MEANS TO FACILITATE THE DISPLAY AND UPDATE OF SAME

(75) Inventors: Edgar Circenis, Fort Collins, CO (US); Bryan J. Jacquot, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 523 days.

(21) Appl. No.: 11/480,033

(22) Filed: Jun. 29, 2006

(51) Int. Cl.
*G01K 1/00* (2006.01)
*G01R 13/00* (2006.01)
*G06F 19/00* (2006.01)

(52) U.S. Cl. .................... 702/130; 702/67

(58) Field of Classification Search .......... 702/130, 702/67, 64, 127, 138, 179, 182, 190, 193; 374/100; 345/440.1
See application file for complete search history.

(56) References Cited

U.S. PATENT DOCUMENTS 5,432,932 A * 7/1995 Chen et al. .............. 718/103
6,952,808 B1 * 10/2005 Jamieson et al. .......... 715/833
7,073,125 B1 * 7/2006 Nystrom et al. ........... 715/703

OTHER PUBLICATIONS

"HP Integrity Virtual Machines Release Notes"; HP Invent; Feb. 2006; 30 pp.
http://vvww.mach1performance.org/images/fb3g.jpg; Dec. 20, 2005; 1 p.
http://www.slickcar.com/productdetails.asp?ProductID=883; "Ford 99-00 Mustang Cobra Speed glo Gauges—#SGD—2056"; SlickCar.com; at least as early as Jun. 27, 2006; 3 pp.
www.outboards-direct.co.uk/awp-pro/viewdetails.asp?vid=24 &rip=4; Model: System Check; Outboards-Direct; at least as early as Jun. 27, 2006; 1 p.
Ofria; "Understanding Your Dashboard Gauges"; SmartTrac Computer Systems Inc.; 1983-2005; http://www.familycar.com/Classroom/dashboard.htm; 5 pp.
"ExplanationofGuages onthe Opening Page of Dashboard v2.0"; Virginia Department of Transportation—Dashboard II Business Rules; Jun. 15, 2005; 3 pp.
Rowe; Audio Recording and Processing under Linux; at least as early as Mar. 2006; http://infohost.nmt.edu/~kscott/audio/; 3 pp.

* cited by examiner

*Primary Examiner*—Michael P. Nghiem
*Assistant Examiner*—Cindy H Khuu

(57) ABSTRACT

In one embodiment, a computer-implemented method of indicating measurement values involves: receiving a plurality of measurement values; dynamically determining a normal range for a current one of the measurement values; and displaying and dynamically updating a gauge having 1) a normal range indicia that indicates the normal range for the current one of the measurement values, and 2) an indicia of the current one of the measurement values. Other embodiments are also disclosed.

23 Claims, 4 Drawing Sheets

US 7,636,643 B1

GAUGE HAVING A DYNAMICALLY UPDATED INDICIA OF A VALUE'S NORMAL RANGE, AND METHODS AND MEANS TO FACILITATE THE DISPLAY AND UPDATE OF SAME

BACKGROUND

A gauge is often used to display a current measurement value, such as a current temperature, pressure, voltage or resource usage level. Traditionally, gauges have had direct links to the systems that they monitor. However, it has also become common to deploy gauges in software environments (e.g., as part of a graphical user interface (GUI), wherein a gauge may be variously, but indirectly, linked to a mechanical, electrical, software or other type of system that it monitors.

BRIEF DESCRIPTION OF THE DRAWINGS

Illustrative embodiments of the invention are illustrated in the drawings, in which.

DETAILED DESCRIPTION

Figure 1:
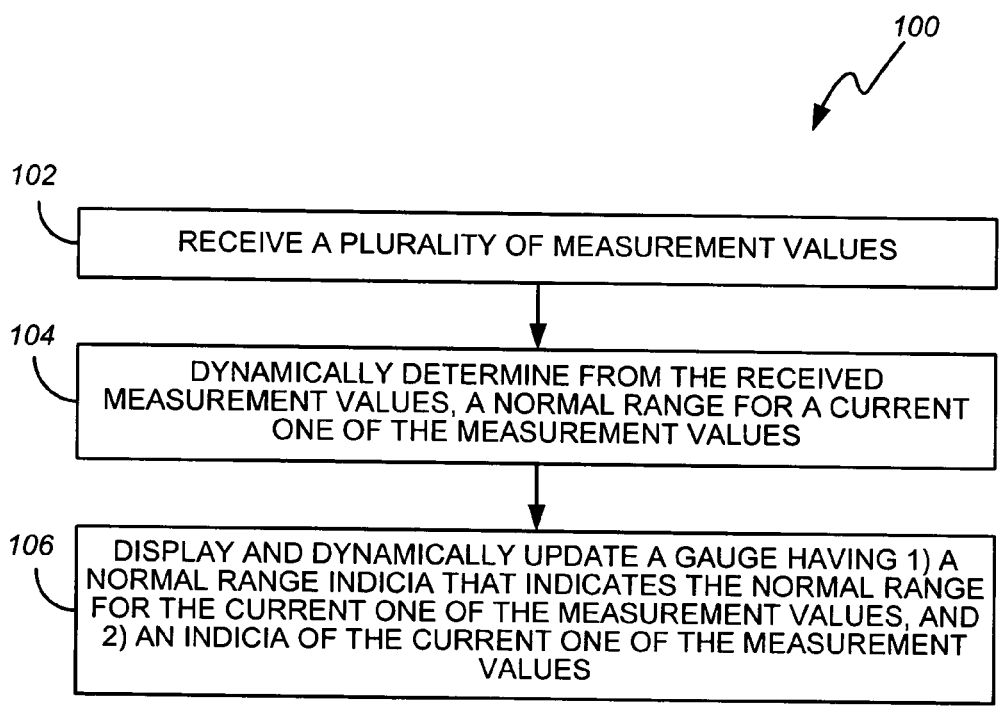
FIG. 1 illustrates a first exemplary method for displaying measurement values.

As a preliminary manner, it is noted that, in the following description, like reference numbers appearing in different drawing figures refer to like elements/features. Often, therefore, like elements/features that appear in different drawing figures will not be described in detail with respect to each of the drawing figures.

As disclosed in the Background of this document, a gauge may be used to display a current measurement value, such as a current temperature, pressure, voltage or resource usage level. In some cases, the components of a gauge may be generated via firmware or software, and displayed via a liquid crystal display (LCD), a monitor, or other means.

At times, a gauge will incorporate hash marks, a differently colored region, or other indicia to indicate the "normal range" for a measured value. For a well-behaved value, displaying the value's normal range can help a user quickly determine whether a value is inside or outside its normal range. However, some values are not well-behaved. For example, a software application deployed in a first environment might normally require 30% of a server's resources, while deployment of the same application in a second environment might normally require 70% of a server's resources. If a gauge is configured to display a static "normal" range for the application's resource demand, the gauge might show normal resource demand in the application's first environment, and excessive resource demand in the application's second environment. However, the application's resource demand in each environment might be entirely normal, expected and appropriate.

As another example of a measured value that is not well-behaved, consider an application that typically uses 10% of a system's resources during the late evening and morning, and 90% of a system's resources during the afternoon and early evening. If a gauge is configured to display a static "normal" range for the application's resource demand, the gauge might show normal resource demand during the morning, and excessive resource demand in the early evening. However, if the user expects the application to have a greater resource demand in the early evening, and knows that the additional server resources are available in the early evening, then the application's increased resource demand at this time might be entirely normal, expected and appropriate.

In light of the above examples, the inventors have concluded that gauges displaying a static "normal" range are not necessarily useful in identifying the normal range of a measured value that is not well-behaved. A new gauge, having a dynamically updated indicia of a value's normal range, is therefore described below. Methods and means to facilitate the display and update of such a gauge are also disclosed.

Referring to FIG. 1, there is shown a first exemplary computer-implemented method 100 for displaying measurement values. In accord with the method 100, a plurality of measurement values are received (at block 102), and a normal range for a current one of the measurement values is dynamically determined from the received measurement values (at block 104). A gauge is then displayed and dynamically updated (at block 106). The gauge includes 1) a normal range indicia that indicates the normal range for the current one of the measurement values, and 2) an indicia of the current one of the measurement values. As the current measurement value changes, both the indicia of the current measurement value, as well as the indicia of the normal range for the current measurement value, can be dynamically updated. In some cases, the normal range indicia can be updated continuously, and in other cases the normal range indicia might be updated only periodically (e.g., after the receipt of every Nth measurement value).

Figure 2:
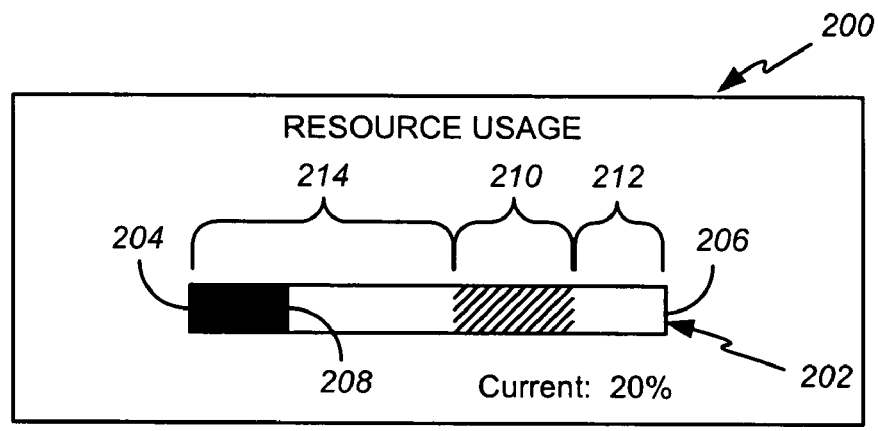
FIG. 2 illustrates an exemplary gauge with a current measurement value below the normal range.

An exemplary embodiment of the gauge displayed by the method 100 is shown in FIG. 2. As shown, the gauge 200 comprises a bar 202 having a "low value" at its left end 204 and a "high value" at its right end 206. The value of a current measurement value is shown by changing the color of the bar (or filling the bar with a fill 208) in a thermometer-fashion from left to right. The value of the current measurement value is also displayed numerically, below the bar. As the value of the current measurement value changes, the length of the colored portion 208 of the bar 200, as well as the numerical value, are dynamically updated to reflect the changes in the current measurement value.

Figure 3:
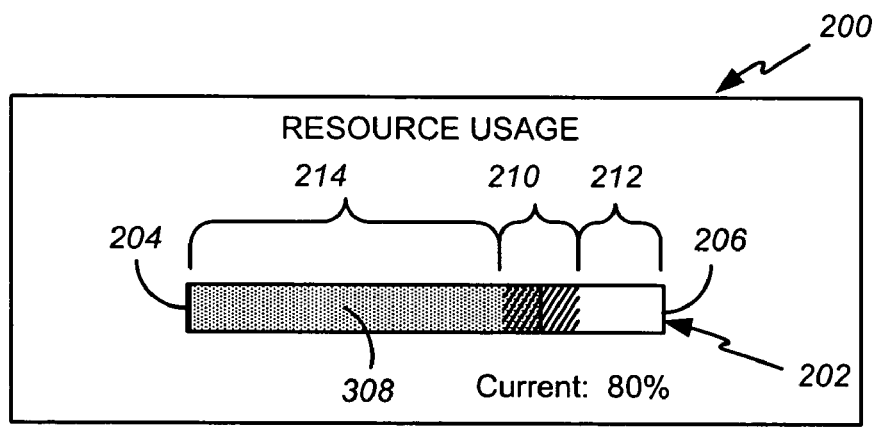
FIG. 3 illustrates the exemplary gauge with a current measurement value within the normal range.
Figure 4:
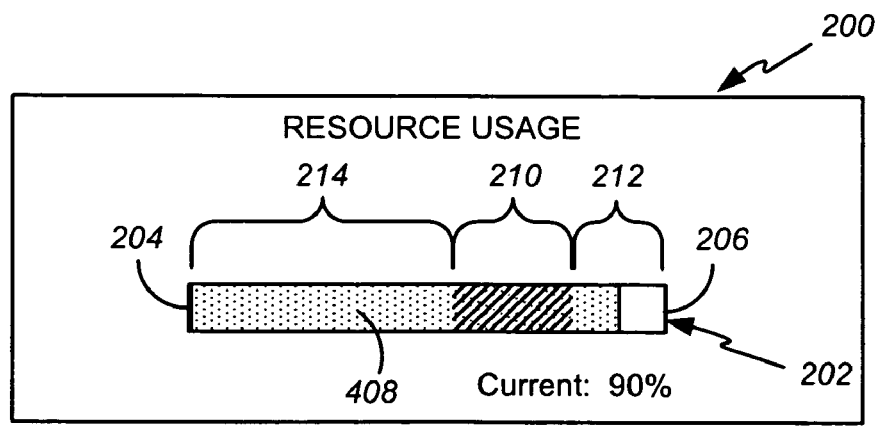
FIG. 4 illustrates the exemplary gauge with a current measurement value above the normal range.

The gauge 200 also comprises a region 210 that is colored, filled, or otherwise displayed, to indicate a normal range for the current measurement value. In one embodiment, the fill 208 that is indicative of the value of the current measurement value is semi-opaque, and as it moves into and/or past the normal region 210, the normal region 210 remains visible as a somewhat lightened (or darkened) portion of the fill 208. See, for example, FIGS. 3 & 4. FIG. 3 illustrates the movement of a fill 308 into the normal region 210; and FIG. 4 illustrates the movement of a fill 408 past the normal region 210.

The boundaries of the normal region 210, as well as its center-of-gravity, may be dynamically determined from past measurement values. For example, if 100 measurement values have been received, the average or median of these values could be used to determine the center-of-gravity of the normal region 210 for a current measurement value. However, if 1000 measurement values have been received, the average or median of all 1000 measurement values, or the average or median of the most recent 100 measurement values, could be used to determine the center-of-gravity of the normal region 210. Other mathematical formulae or value selection methods could also be used to determine the center-of-gravity of the normal region 210.

Regardless of the formula used to determine the center-of-gravity of the normal region 210, one can appreciate that, as measurement values are received over a period of time, the sample population of measurement values changes, and so too can the center-of-gravity of the normal region 210 change.

Additionally, or alternately, the boundaries of the normal region 210 can be dynamically determined from past measurement values. In one embodiment, the boundaries of the normal region 210 may be determined by determining a standard deviation for all of the measurement values that have been received. In another embodiment, the boundaries of the normal region 210 may be determined by determining a standard deviation for a group of measurement values that were received at particular times, or during a given time period. In yet other embodiments, the boundaries of the normal region 210 may be determined by: determining a percentile range of some or all of the measurement values; defining a window of predetermined width about a center-of-gravity; or by other means.

In addition to the normal region 210, the gauge 200 may comprise one or more regions 212, 214 to indicate that a current measurement value is above or below normal. However, above-normal and/or below-normal conditions may also be signaled by displaying at least a portion of the gauge 200 in an alternate visual display scheme. By way of example, the alternate visual display scheme may be an alternate color scheme, an alternate fill pattern, or some other sort of alternate "look and feel".

As shown in FIGS. 2-4, the gauge 200 is provided with 1) a below-normal visual display scheme to indicate when a current measurement value is below its normal range (see the color or fill 208 of the bar 200 shown in FIG. 2); a normal visual display scheme to indicate when a current measurement value is within its normal range (see the color or fill 308 of the bar shown in FIG. 3); and an above-normal visual display scheme to indicate when a current measurement value is above its normal range (see the color or fill 408 of the bar 200 shown in FIG. 4). In some embodiments, the fills 208 and 408 may be colored red, orange or yellow to indicate "urgency" or "caution"; and the fill 308 may be colored blue or green to indicate an "acceptable" condition.

In one embodiment, the gauge 200 could be modified to provide more than just "above-normal", "normal" and "below-normal" regions. That is, the gauge 200 could be modified to identify one or more gradations, or tiers, of "normal" and/or "non-normal" operation. In such a gauge, the width of each range could be identified using any of the afore-mentioned statistical methods (or others). Then, as the fill 208 moved into different ones of the regions during actual use of the gauge, the color or some other characteristic of the fill 208 could change to signify movement of the current measurement value into a particular one of the regions. As with a single normal region 210, the extent of each region could be dynamically updated as new measurement values are received.

In some cases, a collection or database of measurement values may be received prior to execution of the method 100 (FIG. 1). However, in most cases, it is expected that the method 100 will be applied to a plurality of measurement values received over time. The normal range for a current measurement value may then be determined based on statistical analysis of all prior measurement values, or only certain measurement values. For example, the normal range for a current measurement value may be based on: the last N measurement values; a number of measurement values received over a period of time; or a number of measurement values received at particular times (or during particular time periods). If the normal range for a current measurement value is based on past measurement values that were received at particular times (or during particular time periods), then, in some cases, the particular times or periods may be programmable.

Extending the concept introduced in the above paragraph, it is noted that, in one variant of the method 100 (FIG. 1), some or all of the received measurement values may be associated with a number of corresponding filter keys. The filter keys may take various forms, and may include data such as: the time a measurement value was taken; the time a measurement value was received; network load conditions; physical conditions; or a measurement source identifier.

If measurement values are associated with such keys, then the normal range for a current measurement value may be determined based on past measurement values that share at least one common filter key with the current measurement value. For example, in the case of a software application's resource demands, it may be expected that the application will normally demand relatively few resources in the late evening, but significant resources in the late afternoon. If this is known and understood by a user, and is considered "normal", then it may be useful to determine the normal range for a "late afternoon" measurement value by comparing it to other "late afternoon" measurement values. Similarly, if an automobile's engine temperature is expected to increase under heavy engine loads, then it may be useful to determine the normal range for an engine's current temperature by comparing it to engine temperatures that have been recorded under similar load conditions.

Although the gauge 200 is shown to be a bar-style thermometer gauge, the gauge or gauges employed by the method 100 may take various other forms. For example, a gauge may take the form of a rotary or "dial" gauge. In either a bar-style or dial-style gauge, a current measurement value may be represented by a needle. Furthermore, if the gauge is an aircraft-style gauge, the location of the needle itself may remain constant, and the remainder of the gauge may move in relation to the needle.

Figure 5:
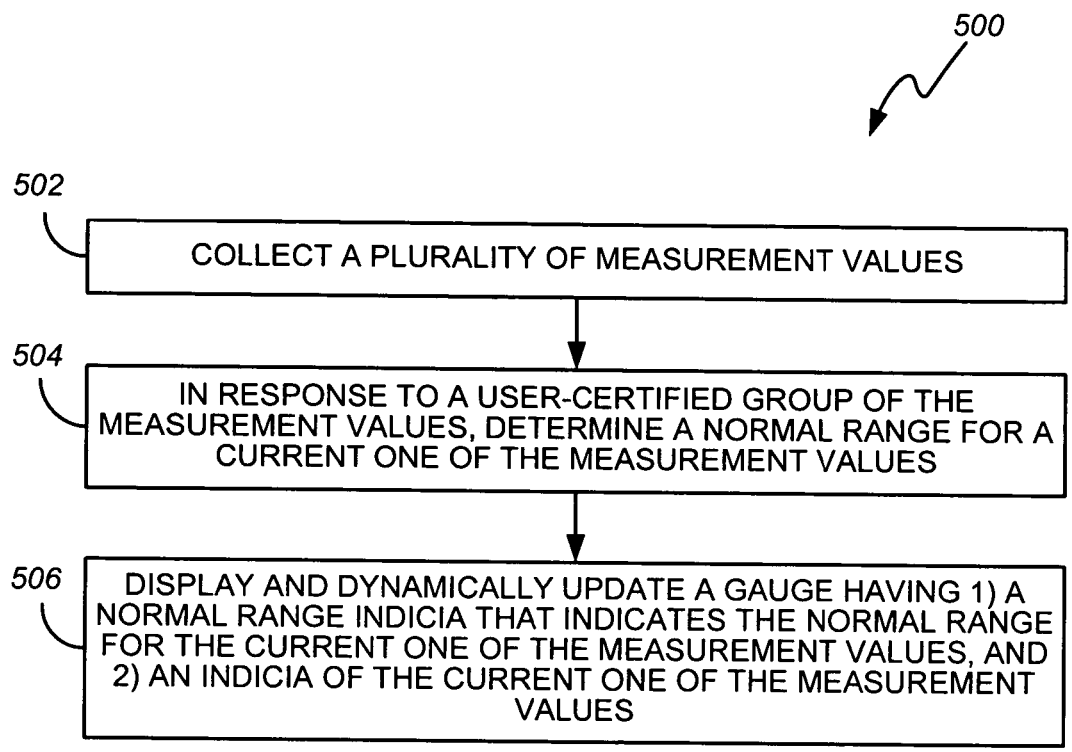
FIG. 5 illustrates a second exemplary method for displaying measurement values.

FIG. 5 illustrates a second exemplary computer-implemented method 500 for displaying measurement values. In accord with the method 500, a plurality of measurement values are collected (at block 502). Then, and in response to a user-certified group of the measurement values, a normal range for a current one of the measurement values is determined (at block 504). A gauge is then displayed and dynamically updated (at block 506). The gauge includes 1) a normal range indicia that indicates the normal range for the current one of the measurement values, and 2) an indicia of the current one of the measurement values. In one embodiment, the gauge is implemented in the same manner as the gauge 200 shown in FIGS. 2-4.

The method 500 can be advantageous in that it allows a user to certify (or "bless") collected measurement values as being normal. In this manner, a user may 1) discard certain measurement values as not being representative of what is "normal", or 2) regulate how often the normal range for collected measurement values is updated.

In one embodiment of the method 500, a user may, on their own initiative, access a store of collected measurement values and tag, edit or group ones of the measurement values to certify them as "normal". In another embodiment, software may prompt a user to certify a collection of measurement values as being normal. By way of example, the software may prompt the user at periodic time intervals, after collection of N measurement values, or upon the occurrence of some sort of event (such as one or more recent measurement values falling outside of the current normal range).

Figure 6:
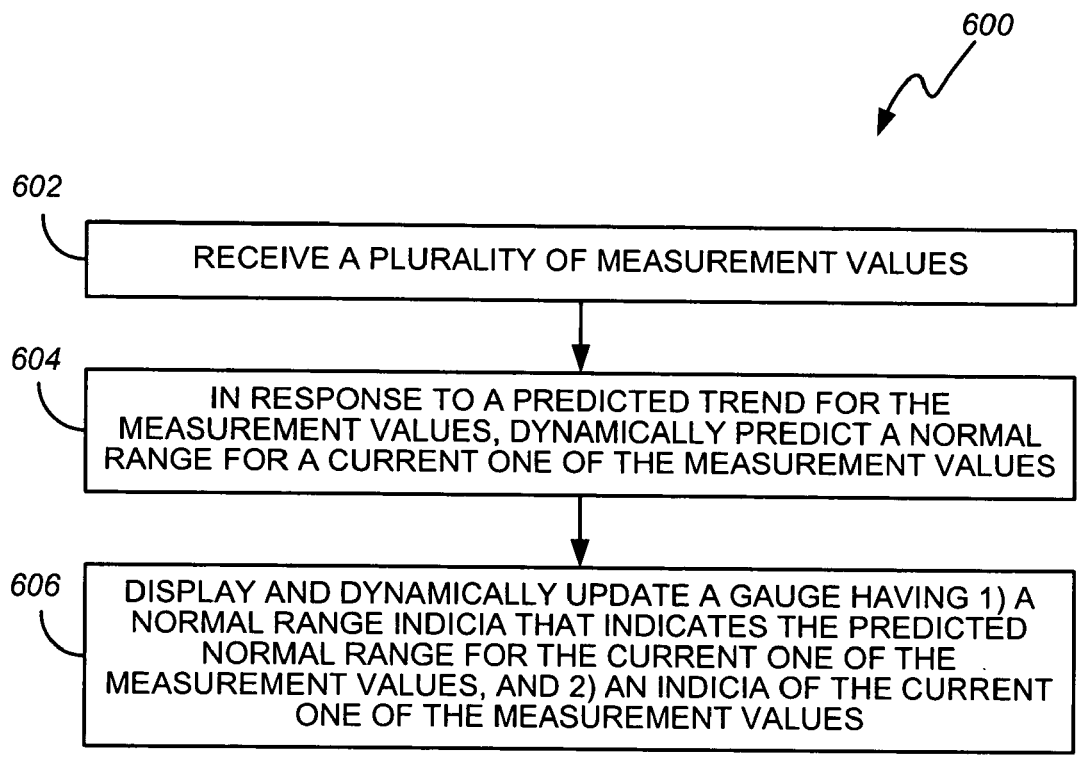
FIG. 6 illustrates a third exemplary method for displaying measurement values.

FIG. 6 illustrates a third exemplary computer-implemented method 600 for displaying measurement values. In accord with the method 600, a plurality of measurement values are received (at block 602). Then, and in response to a predicted trend for the measurement values, a normal range for a current one of the measurement values is dynamically predicted (at block 604). A gauge is then displayed and dynamically updated (at block 606). The gauge includes 1) a normal range indicia that indicates the normal range for the current one of the measurement values, and 2) an indicia of the current one of the measurement values. In one embodiment, the gauge is implemented in the same manner as the gauge 200 shown in FIGS. 2-4.

The method 600 can be advantageous in that it can account for "expected" trends and save a user from having to certify measurement values as being normal. For example, if 10% year over year growth is expected for a certain measurement value (such as web traffic), the normal range for the measurement value can be dynamically updated to reflect the expected growth.

Typically, the methods 100, 500 and 600 will be implemented by means of sequences of instructions that are stored on a number of machine-readable media. When executed, the instructions then cause the machine to perform the actions of the methods 100, 500, 600 (or their variants). The machine-readable media may include, for example, any number or mixture of fixed or removable media (such as one or more fixed disks, random access memories (RAMs), read-only memories (ROMs), or compact discs), at either a single location or distributed over a network. The sequences of instructions may take the form of software, firmware or other forms of machine-readable instructions.

What is claimed is:

1. A computer-implemented method of displaying measurement values, comprising:
   receiving a plurality of measurement values over time;
   dynamically determining from the received measurement values, a normal range for a current one of the measurement values, the dynamically determining the normal range comprising determining the normal range in terms of a plurality of the measurement values received at particular times and determining a standard deviation of the measurement values received at the particular times; and
   displaying and dynamically updating a gauge having 1) a normal range indicia that indicates the normal range for the current one of the measurement values, and 2) an indicia of the current one of the measurement values.

2. The method of claim 1, further comprising, displaying at least a portion of the gauge with an alternate visual display scheme to indicate when the current one of the measurement values is outside of the normal range.

3. The method of claim 2, wherein the alternate visual display scheme comprises an alternate color scheme.

4. The method of claim 2, wherein the alternate visual display scheme comprises an alternate fill pattern.

5. The method of claim 2, wherein the alternate visual display scheme comprises:

a below-normal visual display scheme to indicate when the current one of the measurement values is below the normal range; and
an above-normal visual display scheme to indicate when the current one of the measurement values is above the normal range.

6. The method of claim 1, wherein the particular times are programmable.

7. The method of claim 1, wherein the particular times are defined by a time period.

8. The method of claim 1, wherein determining the normal range further comprises determining a percentile range of the measurement values received at the particular times.

9. The method of claim 1, wherein:
   at least some of the measurement values are received with a number of corresponding filter keys; and
   dynamically determining the normal range for the current one of the measurement values comprises determining the normal range based on ones of the measurement values sharing at least one common filter key with the current one of the measurement values.

10. The method of claim 1, further comprising, dynamically determining from the received measurement values, plural gradations of the normal range for the current one of the measurement values; wherein displaying and dynamically updating the gauge further comprises, displaying and dynamically updating indicia that indicates the plural gradations of the normal range for the current one of the measurement values.

11. The method of claim 1, further comprising, dynamically determining from the received measurement values, plural gradations of a non-normal range for the current one of the measurement values; wherein displaying and dynamically updating the gauge further comprises, displaying and dynamically updating indicia that indicates the plural gradations of the non-normal range for the current one of the measurement values.

12. A number of machine-readable media having stored thereon sequences of instructions that, when executed by a machine, cause the machine to perform the actions of:
   receiving a plurality of measurement values, wherein at least some of the measurement values are received with a number of corresponding filter keys;
   dynamically determining from the received measurement values, a normal range for a current one of the measurement values, said dynamically determining the normal range comprising determining the normal range based on ones of the measurement values sharing at least one common filter key with the current one of the measurement values; and
   displaying and dynamically updating a gauge having 1) a normal range indicia that indicates the normal range for the current one of the measurement values, and 2) an indicia of the current one of the measurement values.

13. The machine-readable media of claim 12, wherein the instructions for displaying the gauge further comprise instructions for displaying a non-normal range indicia to indicate when the current one of the measurement values is outside of the normal range.

14. The machine-readable media of claim 12, further comprising instructions that, when executed by the machine, cause the machine to perform the action of displaying at least a portion of the gauge with an alternate visual display scheme to indicate when the current one of the measurement values is outside of the normal range.

15. The machine-readable media of claim 14, wherein the alternate visual display scheme is an alternate color display scheme.

16. The machine-readable media of claim 12, wherein the instructions cause the measurement values to be received over time; and wherein the instructions cause the normal range to be determined in terms of a plurality of the measurement values received at particular times.

17. A gauge, comprising:
- a dynamically updated indicia of a current measurement value; and
- a dynamically updated indicia of a normal range for the current measurement value, the normal range being dynamically determined based on a plurality of past measurement values,
- wherein the gauge receives a plurality of measurement values over time and dynamically determines from the received measurement values, a normal range for a current one of the measurement values, the dynamically determining the normal range comprising determining the normal range in terms of a plurality of the measurement values received at particular times and determining a standard deviation of the measurement values received at the particular times.

18. The gauge of claim 17, further comprising:
- alternate visual display schemes for the gauge, wherein a current visual display scheme is selected based upon the current measurement value being inside or outside of the normal range.

19. The gauge of claim 18, wherein the alternate visual display schemes are alternate color display schemes.

20. The gauge of claim 19, wherein the gauge comprises a bar, a portion of which is associated with the indicia of the current measurement value, a region of which is associated with the indicia of the normal range for the current measurement value; and wherein a color display scheme of the bar is dynamically updated in accord with said alternate color display schemes.

21. A computer-implemented method of displaying measurement values, comprising:
- collecting a plurality of measurement values;
- in response to a user-certified group of the measurement values, determining a normal range for a current one of the measurement values; and
- displaying and dynamically updating a gauge having 1) a normal range indicia that indicates the normal range for the current one of the measurement values, the normal range dynamically determined by determining the normal range in terms of a plurality of the measurement values received at particular times and determining a standard deviation of the measurement values received at the particular times, and 2) an indicia of the current one of the measurement values.

22. The method of claim 21, further comprising:
- receiving an update to the user-certified group of measurement values; and
- in response to the update to the user-certified group of measurement values, re-determining the normal range for the current one of the measurement values.

23. A computer-implemented method of displaying measurement values, comprising:
- receiving a plurality of measurement values;
- in response to a predicted trend for the measurement values, dynamically predicting a normal range for a current one of the measurement values; and
- displaying and dynamically updating a gauge having 1) a normal range indicia that indicates the predicted normal range for the current one of the measurement values, the normal range dynamically determined by determining the normal range in terms of a plurality of the measurement values received at particular times and determining a standard deviation of the measurement values received at the particular times, and 2) an indicia of the current one of the measurement values.

\* \* \* \* \*